(12) United States Patent
Yu et al.

(10) Patent No.: US 7,772,107 B2
(45) Date of Patent: Aug. 10, 2010

(54) METHODS OF FORMING A SINGLE LAYER SUBSTRATE FOR HIGH CAPACITY MEMORY CARDS

(75) Inventors: Cheemen Yu, Madison, WI (US); Hem Takiar, Fremont, CA (US); Chih-Chin Liao, Changua (TW)

(73) Assignee: SanDisk Corporation, Milpitas, CA (US)

(*) Notice: Subject to any disclaimer, the term of this patent is extended or adjusted under 35 U.S.C. 154(b) by 797 days.

(21) Appl. No.: 11/538,220

(22) Filed: Oct. 3, 2006

(65) Prior Publication Data

US 2008/0081455 A1 Apr. 3, 2008

(51) Int. Cl.
*H01L 21/44* (2006.01)
*H01L 21/48* (2006.01)
*H01L 21/50* (2006.01)

(52) U.S. Cl. .................. 438/617; 438/612; 438/106; 438/108

(58) Field of Classification Search ............... 438/612, 438/617, 106, 116, 108, 109
See application file for complete search history.

(56) References Cited

U.S. PATENT DOCUMENTS

| 5,811,879 | A | | 9/1998 | Akram | |
| 6,117,705 | A | * | 9/2000 | Glenn et al. | 438/106 |
| 6,271,057 | B1 | | 8/2001 | Lee et al. | |
| 6,707,168 | B1 | * | 3/2004 | Hoffman et al. | 257/796 |
| 2002/0003308 | A1 | * | 1/2002 | Kim et al. | 257/778 |
| 2003/0151139 | A1 | | 8/2003 | Kimura | |
| 2004/0113284 | A1 | | 6/2004 | Zhao et al. | |
| 2006/0043514 | A1 | | 3/2006 | Shizuno | |
| 2006/0118831 | A1 | | 6/2006 | Hwang et al. | |

FOREIGN PATENT DOCUMENTS

JP 11102989 A 4/1999

OTHER PUBLICATIONS

International Search Report dated Mar. 27, 2008, International Application No. PCT/US2007/079450.
International Preliminary Report on Patentability and Written Opinion of the International Searching Authority dated Apr. 7, 2009 in PCT Application No. PCT/US2007/079450.

* cited by examiner

*Primary Examiner*—Chuong A. Luu
(74) *Attorney, Agent, or Firm*—Vierra Magen Marcus & DeNiro LLP

(57) ABSTRACT

Methods of forming a semiconductor package including a single-sided substrate are disclosed. In a first embodiment of the present invention, a substrate may include a conductive layer on a top surface of the substrate, i.e., on the same side of the substrate as where the die are mounted. In a second embodiment of the present invention, a substrate may include a conductive layer on a bottom of the substrate, i.e., on the opposite side of the substrate as where the die are mounted.

17 Claims, 15 Drawing Sheets

(Top View)

(Bottom View)

(Cross-Sectional View)

(Top View)

(Bottom View)

(Cross-Sectional View)

(Top View)

(Bottom View)

(Cross-Sectional View)

*(Top View)*

*(Bottom View)*

*(Cross-Sectional View)*

(Top View)

(Bottom View)

(Cross-Sectional View)

(Cross-Sectional View)

(Top View)

(Bottom View)

(Cross-Sectional View)

(Top View)

(Bottom View)

(Cross-Sectional View)

*(Top View)*

*(Bottom View)*

*(Cross-Sectional View)*

(Top View)

(Bottom View)

(Cross-Sectional View)

(Top View)

(Bottom View)

(Cross-Sectional View)

(Cross-Sectional View)

METHODS OF FORMING A SINGLE LAYER SUBSTRATE FOR HIGH CAPACITY MEMORY CARDS

BACKGROUND OF THE INVENTION

1. Field of the Invention

Embodiments of the present invention relate to methods of forming a semiconductor package formed on a substrate plated with conductive material only on a single side.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices. These devices include for example digital music players, cellular phones, handheld PCs, digital cameras, digital video camcorders, smart phones, car navigation systems and electronic books.

Flash memory storage cards come in a number of different configurations, but generally include a semiconductor package housed within a standard sized and shaped enclosure. These standard enclosures include SD (Secure Digital) cards, a Compact Flash, a Smart Media, a Mini SD Card, an MMC, an xD Card, a Transflash memory card or a Memory Stick. The semiconductor package used in such memory devices includes an integrated circuit typically having passive components, one or more memory chips and, in some configurations, a controller chip mounted on and electrically connected to a substrate. Substrates on which the integrated circuit may be formed include printed circuit boards, leadframes and polyimide tapes. Once formed on the substrate, these integrated circuits are typically encapsulated in a molding compound which protects the integrated circuit and removes heat from the package.

Where once memory devices included a plurality of discrete semiconductor packages, each handling different functions, currently a plurality of integrated circuit components may be packaged together to provide a complete electronic system in a single package. For example, multichip modules ("MCM") typically include a plurality of chips mounted side by side on a substrate and then packaged. Another example is a system-in-a-package ("SiP"), where a plurality of chips may be stacked on a substrate and then packaged.

A conventional, two-sided semiconductor package 20 is shown (without encapsulation) in prior art FIGS. 1 and 2. Package 20 may be a land grid array (LGA) package, including a substrate 22 on which are mounted a pair of semiconductor die 24 (shown only in outline in FIG. 1). The substrate 22 may in general include a dielectric core 26 having conductive layers 28 and 30 formed on its top and bottom surfaces. A conductance pattern of electrical traces may be defined in one or both conductive layers. Through-holes, or vias, 32 are formed through the substrate, and plated to allow electrical communication between the conductance patterns on the top and bottom surfaces of the substrate. Bond pads 34 may be provided on the substrate 22 to which wire bonds 36 (seen in FIG. 2) may be ultrasonically welded to electrically couple the die 24 to the substrate 22. Contact fingers 38 may also be provided on substrate 22 for mating with similar contacts on a host device into which package 20 may be inserted. The contact fingers 38 are located on a side of the substrate opposite the die 24 and bond pads 34. Consequently, LGA packages have conductive layers and plating on both sides of the substrate as shown.

The copper of the conductive layers 28 and 30 provides a generally poor bonding surface for welding the wire bonds 36 to the bond pads 34. Copper also provides a poor surface for withstanding the repeated engagements undergone by the contact fingers 38. It is therefore known to plate the bond pads and contact fingers with, for example, gold or nickel/gold (Ni/Au) plating.

A double-sided substrate (i.e., one having a conductive layer on both its top and bottom surfaces as shown in FIG. 2) is a relatively costly structure to manufacture. A previous approach to overcome this problem was to stack a maximum number of die on the double-sided substrate. However, present package dimensions and bond pad positioning has made it difficult to further increase the number of die which may be stacked on a substrate. It would therefore be advantageous to find another method for overcoming the high cost of substrate fabrication.

It is known to provide a finished substrate with a single-sided substrate. However, often the substrate is a conventional substrate in which one of the layers has been etched away. For example, United States Patent Application Publication No. 2001/0000156, entitled, "Package Board Structure and Manufacturing Method Thereof," discloses a semiconductor package which, in its assembled state, includes a single-sided substrate. However, the package starts with a laminate core having a copper film on the top and bottom surfaces. During fabrication, one of the copper layers is etched away.

U.S. Pat. No. 6,190,943, entitled, "Chip-Scale Packaging Method," ('943 patent) discloses a chip scale package having a single-sided substrate. However, unlike LGA packages, chip scale packages such as disclosed in the '943 patent, do not require electrical connections to be made from top and bottom surfaces of the substrate. All electrical connections may be established from only the top or bottom side of the substrate.

SUMMARY OF THE INVENTION

Embodiments of the present invention relate to a semiconductor package including a single-sided substrate. In a first embodiment of the present invention, a substrate may include a conductive layer on a top surface of the substrate, i.e., on the same side of the substrate as where the die are mounted. In a second embodiment of the present invention, a substrate may include a conductive layer on a bottom of the substrate, i.e., on the opposite side of the substrate as where the die are mounted.

The first and second embodiments may each include a substrate, which may be a TAB tape available in reel-to-reel configurations. The tape includes a dielectric core. In the first embodiment, the dielectric core may include a plurality of contact finger plating holes. The holes may in general have a rectangular shape and each one sized and positioned to fit within the footprint of a contact finger formed on substrate later in the fabrication process. A conductive layer may be affixed to the dielectric layer on the same side of the dielectric layer that is to receive the semiconductor die.

The conductive layer may be etched to define contact fingers, bond pads and a conductance pattern extending between and connecting certain of the contact fingers and bond pads. The contact fingers are etched so that each finger covers a contact finger plating hole. A plating process may then be performed to plate the bond pads and other conductive surfaces on the top surface of the dielectric layer. In accordance with the first embodiment, a second plating process may be performed plating the back side of the contact fingers; that is, the surfaces of the contact fingers facing the dielectric layer, and exposed through the contact finger plating holes from the lower surface of the dielectric layer. Plating the back side of the contact fingers extends the contact fingers through the dielectric layer, and allows electrical connection of the contact fingers to a host device from a side of the dielectric layer opposite the semiconductor die and conductive layer.

One or more semiconductor die may be affixed to the top surface of substrate, and wire bonded to the bond pads to form an integrated circuit. The integrated circuit may be singulated and encapsulated to provide a finished semiconductor package. The package may be an LGA package, used for example as a flash memory devices such as an SD card, compact flash, smart media, mini SD card, MMC and xD card, or a memory stick.

In a second embodiment of the present invention, the dielectric core may include a plurality of contact finger plating holes. The holes may in general have a rectangular shape and each one sized and positioned to fit within the footprint of a bond pad formed on substrate later in the fabrication process. A conductive layer may be affixed to the dielectric layer on the opposite side of the dielectric layer than the semiconductor die to be affixed to the substrate.

The conductive layer may be etched to define contact fingers, bond pads and a conductance pattern extending between and connecting certain of the contact fingers and bond pads. The bond pads are etched so that each pad covers a bond pad plating hole. A plating process may then be performed to plate the contact fingers, bond pads and other conductive surfaces on the bottom surface of the dielectric layer.

One or more semiconductor die may be affixed to the top surface of substrate, directly on the dielectric layer. The die may be electrically coupled to the substrate in a wire bond process. The wire bond process may entail locating the ends of wire bonds within or adjacent the bond pad holes, then securing the wire bonds in electrical contact with a back side of the bond pads; that is a side of the bond pads facing the dielectric layer and exposed through the bond pad holes. The bond pad holes allow electrical connection of the semiconductor die on the top side of the dielectric layer to the bond pads and contact fingers on the bottom surface of the dielectric layer. The wire bond process completes the formation of an integrated circuit. The integrated circuit may be singulated, and encapsulated to provide a finished semiconductor package. The package may be an LGA package, used for example as a flash memory devices such as an SD card, compact flash, smart media, mini SD card, MMC and xD card, or a memory stick.

DETAILED DESCRIPTION

Embodiments of the invention will now be described with reference to FIGS. 1 through 36 which relate to a semiconductor package including a semiconductor package having a single-sided substrate capable of establishing electrical connections from both sides of the substrate. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

In a first embodiment of the present invention, a substrate may include a conductive layer on a top surface of the substrate, i.e., on the same side of the substrate as where the die are mounted. In a second embodiment of the present invention, a substrate may include a conductive layer on a bottom of the substrate, i.e., on the opposite side of the substrate as where the die are mounted. The first embodiment having a top side conductive-layered substrate is described hereinafter with respect to FIGS. 3 through 19. The second embodiment having a bottom side conductive-layered substrate is described hereinafter with respect to FIGS. 20 through 36.

Figure 1:
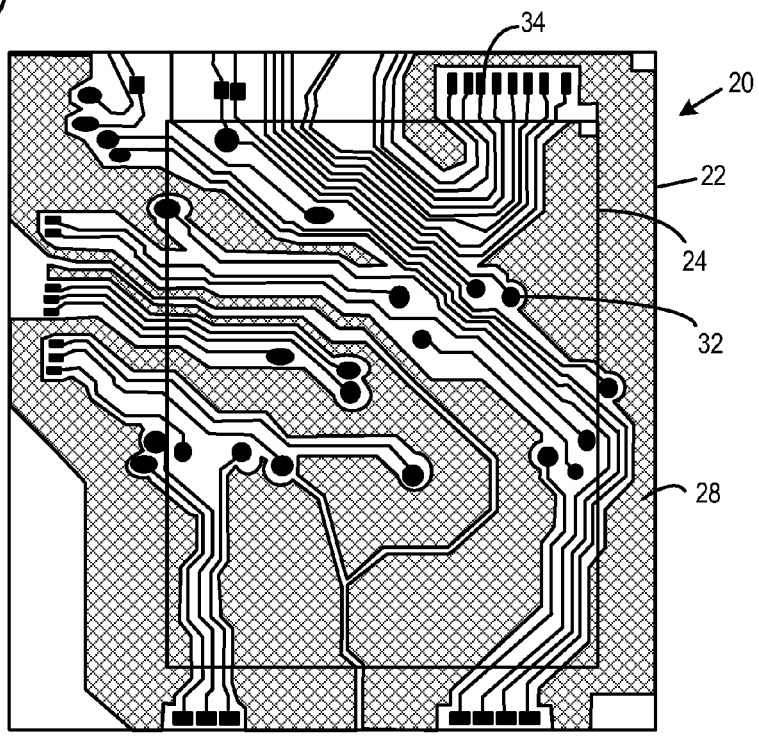
FIG. 1 is a prior art top view of a substrate and outline of a semiconductor die.
Figure 2:
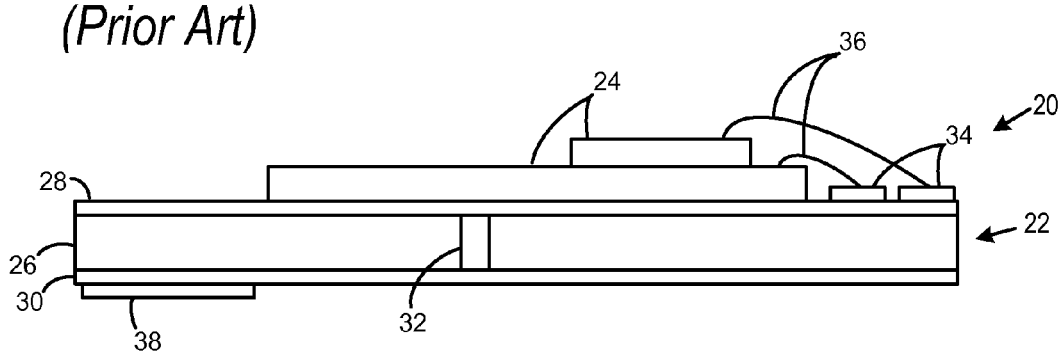
FIG. 2 is a prior art cross-sectional view of the substrate of FIG. 1.
Figure 3:
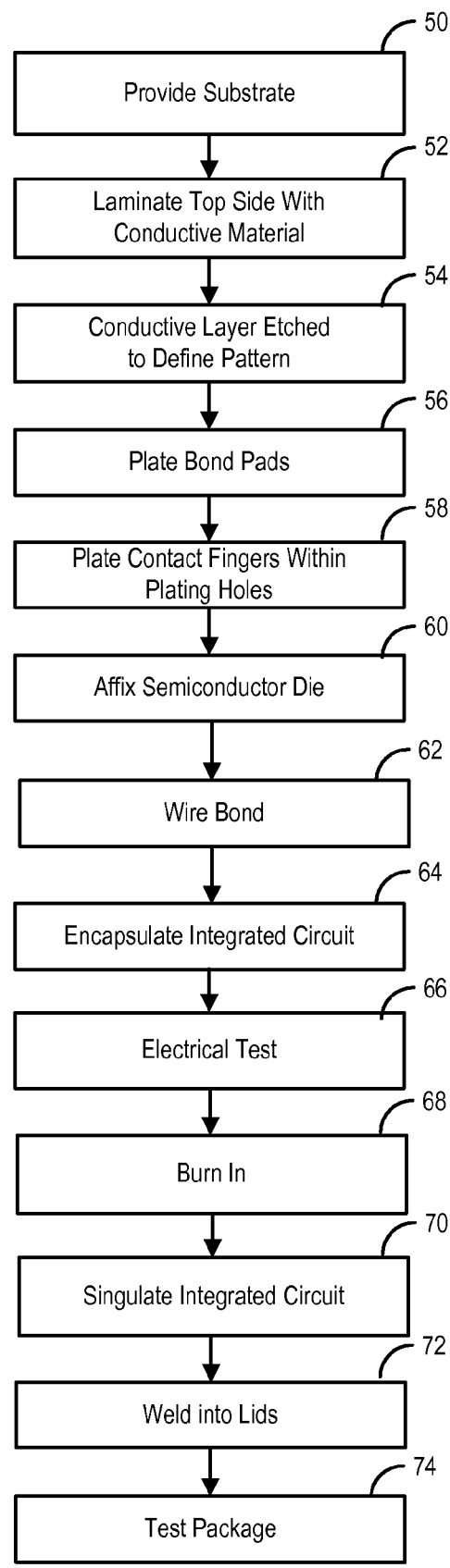
FIG. 3 is a flowchart describing the steps for fabricating a semiconductor package according to a first embodiment of the present invention.
Figure 4:
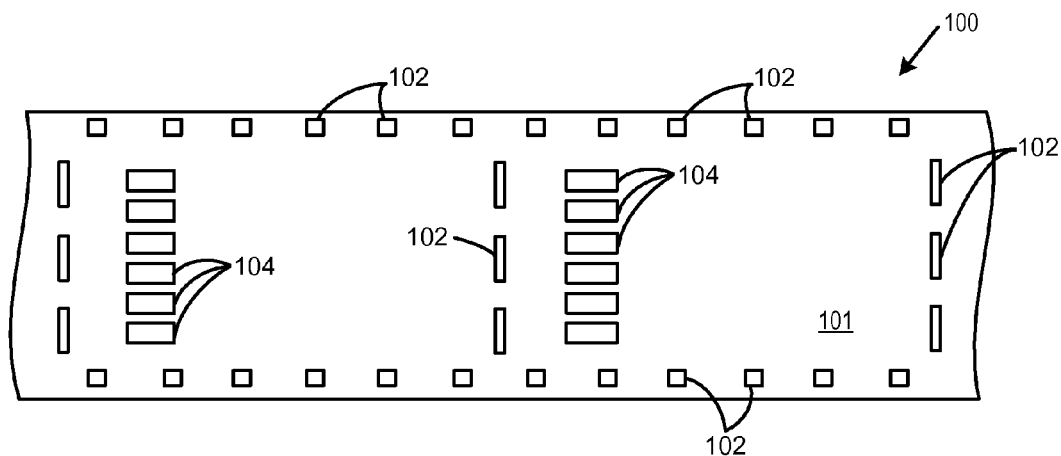
FIGS. 4 through 6 show top, bottom and cross-sectional edge views, respectively of a semiconductor package according to a first embodiment of the present invention during a first stage of fabrication.
Figure 5:
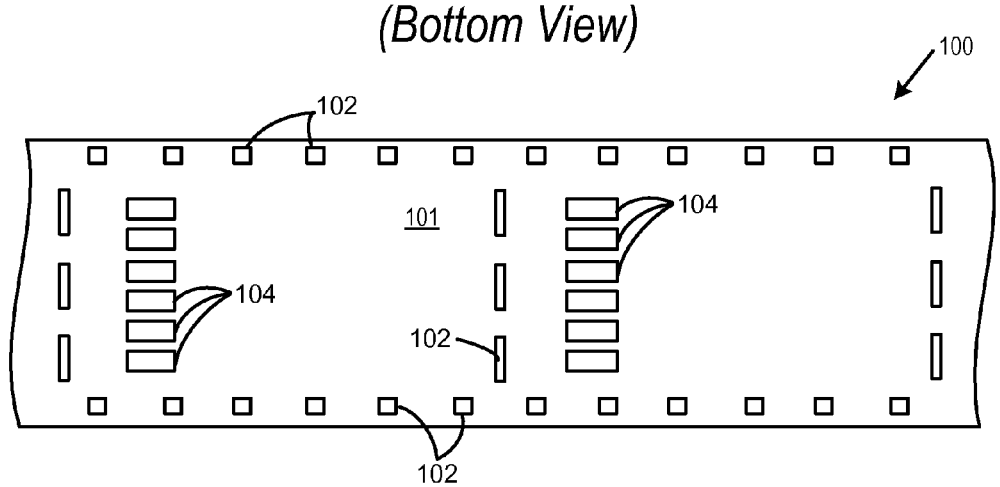
Figure 6:
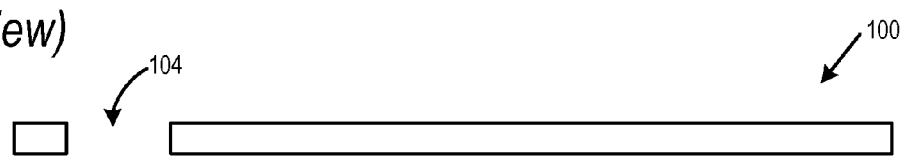

A method for forming a flash memory card including a top side conductive-layered substrate will now be described with reference to the flowchart of FIG. 3 in the views of FIGS. 4 through 19. In embodiments, substrate 100 may be a tape typically used in tape automated bonding ("TAB") processes. Such tapes are conventionally available in reel-to-reel configurations, and in embodiments may include a thin, flexible dielectric core 101, such as polyimide or other dielectric film. The polyimide tape substrate 100 may have a width of 35 mm, 48 mm, or 70 mm, but it is understood that the width of polyimide tape substrate 100 may be different than those dimensions in alternative embodiments of the present invention. Using a TAB tape as substrate 100 provides the advantages of tight pitch of the bond pads formed thereon as explained hereinafter. Line pitches of 45 microns (μm) are known to be achievable on TAB tapes. This allows for high density circuits. However, it is understood that other media may be used for substrate 100 in alternative embodiments, such as printed circuit boards.

The dielectric core 101 may include a plurality of registration holes 102 allowing registration of a position of the tape during the fabrication process. The substrate 100 may further include a plurality of contact finger plating holes 104 for receiving a plating material and for allowing electrical connections through the substrate as explained hereinafter. Contact finger plating holes 104 may in general have a rectangular shape and each one sized and positioned to fit within the footprint of a contact finger formed on substrate 100 as explained hereinafter.

Figure 7:
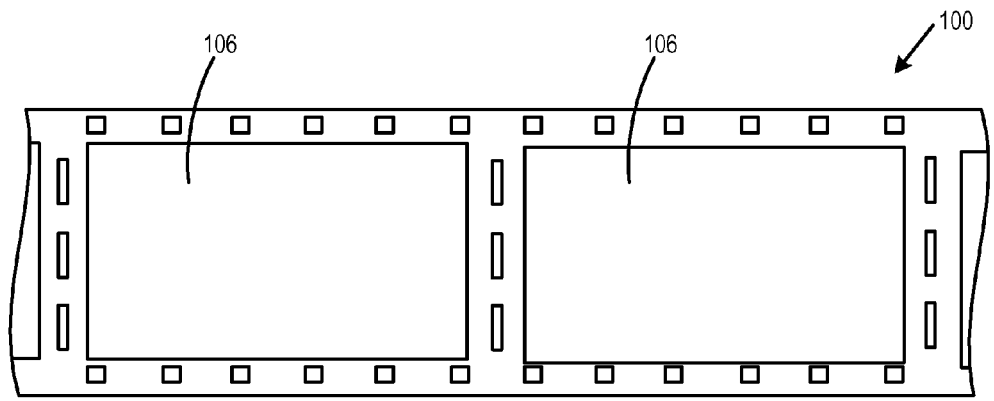
FIGS. 7 through 9 show top, bottom and cross-sectional edge views, respectively of a semiconductor package according to a first embodiment of the present invention during a second stage of fabrication.
Figure 8:
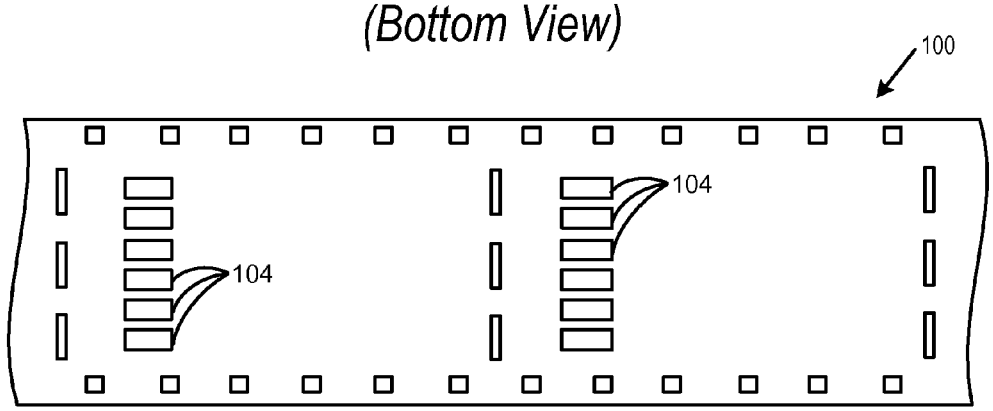
Figure 9:
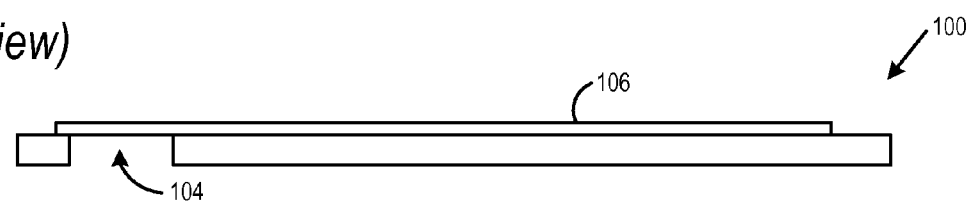

Referring now to FIGS. 7 through 9, in step 52, the top side of substrate 100 may be laminated with a conductive material 106. The conductive material 106 may cover contact finger plating holes 104. The conductive material 106 may be applied in discrete sections, as shown in FIG. 7, or one continuous length along dielectric core 101. As is known in the art, conductive layer 106 may be affixed to the dielectric core layer 101 by various means including electro-deposition or using an adhesive. Conductive layer 106 may be made of copper or copper alloys, Alloy 42 (42Se/58Ni), copper plated steel, or other metals and materials known for use on TAB tapes.

Although not critical to the present invention, in embodiments, the dielectric layer 101 may have a thickness of between 50 to 100 μm, and more particularly, 75 to 85 μm. Conductive layer 106 may be one-half ounce copper, with a thickness ranging between 50 and 100 μm, and more particularly, between 60 and 80 μm. It is understood that the thicknesses of the core and conductive layer may vary above and below the above-described ranges in alternative embodiments of the present invention.

Figure 10:
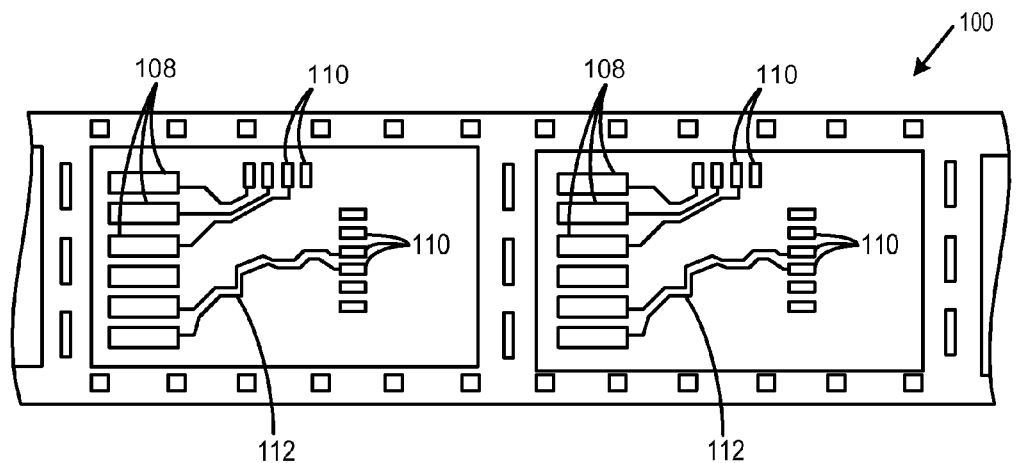
FIGS. 10 through 12 show top, bottom and cross-sectional edge views, respectively of a semiconductor package according to a first embodiment of the present invention during a third stage of fabrication.
Figure 11:
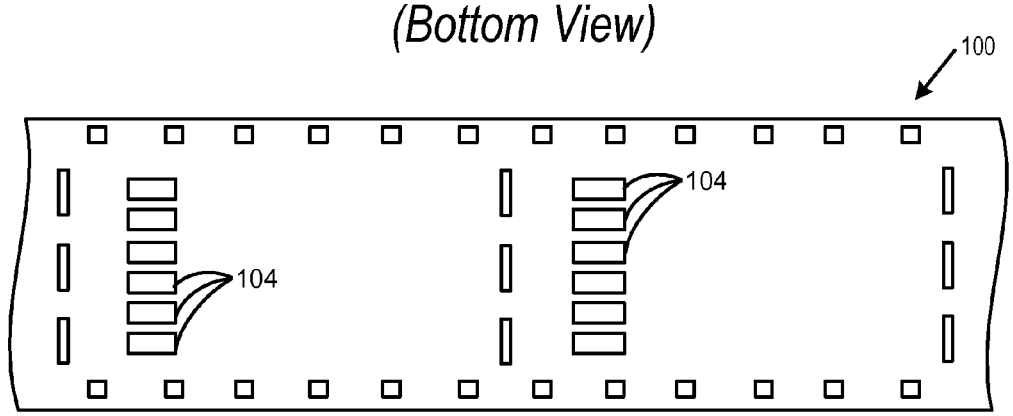
Figure 12:
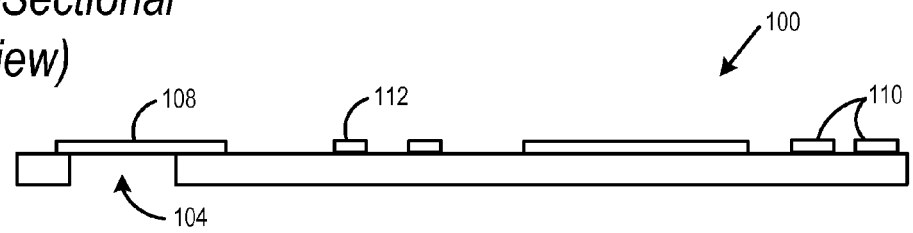

Referring now to FIGS. 10 through 12, the conductive layer may be etched in a step 54 to define a plurality of contact fingers 108, each finger 108 covering a contact finger plating hole 104. Conductive layer 106 may be further etched to define a plurality of bond pads 110 and a conductance pattern 112 including electrical traces extending between contact fingers 108 and bond pads 110. Although not shown in FIG. 10, as is known in the art, a dummy pattern may also be etched in the conductance pattern 112 at sections in between the conductance pattern 112 to reduce thermal and/or mechanical stresses in the substrate and semiconductor die when mounted on substrate 100.

The contact fingers 108, bond pads 110 and conductance pattern 112 may be formed by known processes such as chemical etching. In chemical etching, a photoresist film may be applied to the conductive layer 106. A pattern photomask containing the pattern of the fingers 108, pads 110 and conductive traces 112 (and in embodiments, the dummy pattern) to be formed in layer 106 may then be applied over the photoresist film. The photoresist film may then be exposed and developed to remove the photoresist from areas on the conductance layer to be etched. The exposed areas are next etched away using an etchant such as ferric chloride or the like to define the conductive traces and desired patterns in layer 106. The photoresist may then be removed. Other known chemical etching processes may be used.

Figure 13:
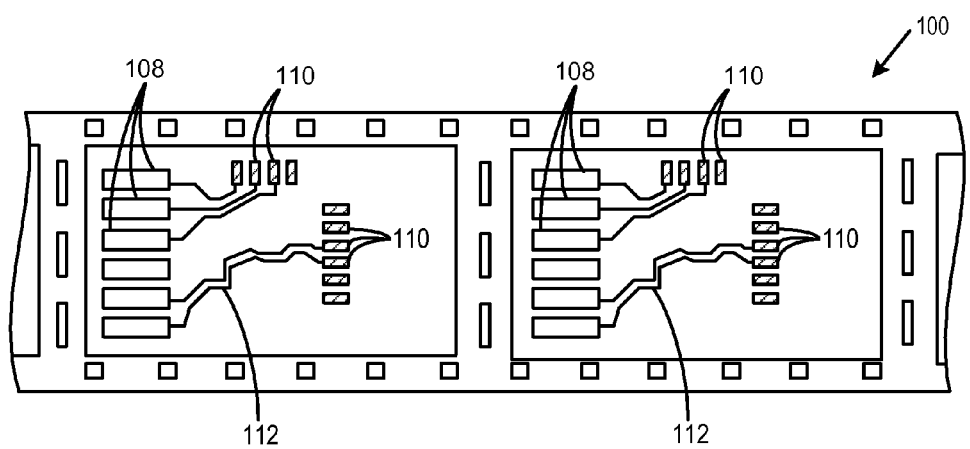
FIGS. 13 through 15 show top, bottom and cross-sectional edge views, respectively of a semiconductor package according to a first embodiment of the present invention during a fourth stage of fabrication.
Figure 14:
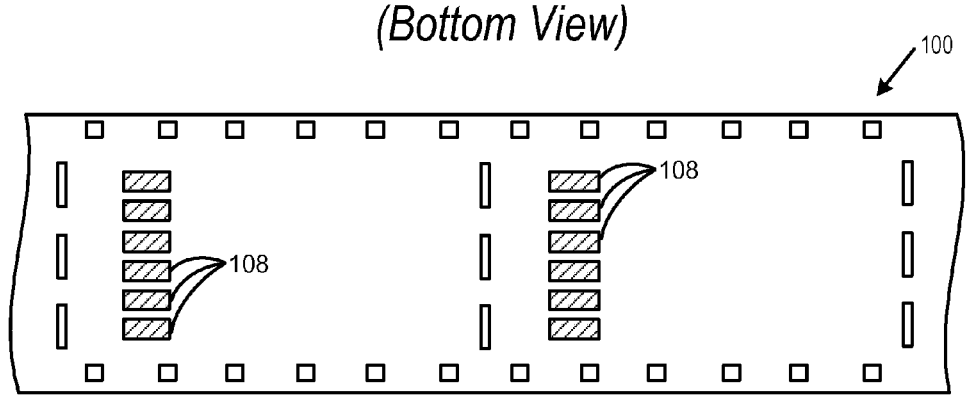
Figure 15:
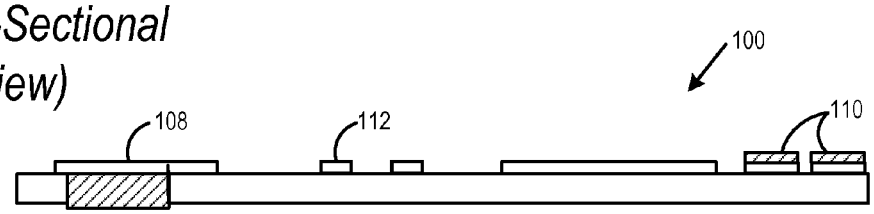

Referring to FIGS. 13 through 15, bond pads 110 may be plated in a step 56. Although not shown in FIGS. 13 and 15, the upper surfaces of the contact fingers 108 on top of the substrate and the conductance pattern 112 may also be plated in step 56. The bond pads 110 and, in embodiments, the contact fingers 108 and conductance pattern 112, may be plated by known processes such as for example an electroplating process. In an electroplating process, the substrate may be immersed in an alkaline solution containing ions of the plating material. A current is provided to the surfaces to be plated, which current attracts the metal ions to plate on the surfaces as desired. In embodiments, a material plated on the top surface of substrate 100 may be a soft gold or a soft nickel/gold alloy (Ni/Au). As is known in the art, each of the conductive traces, bond pads 110 and contact fingers 108 to be plated may be shorted together with plating lines to facilitate the plating process, which plating lines are severed or removed after the plating process is completed.

Although not shown, a layer of solder mask may be applied over the conductance pattern and the upper surfaces of the contact fingers on the top surface of the substrate instead of or in addition to plating those surfaces.

As is also shown in FIGS. 13 through 15, the back side of contact fingers 108 may be plated by filling contact finger plating holes 104 with a plating material in step 58. In particular, a plating material may be applied within contact finger plating holes 104 to the back side of contact fingers 108 in a known plating process, such as for example as described above. In embodiments, the plating material may be a hard gold or a hard Ni/Au alloy.

Figure 16:
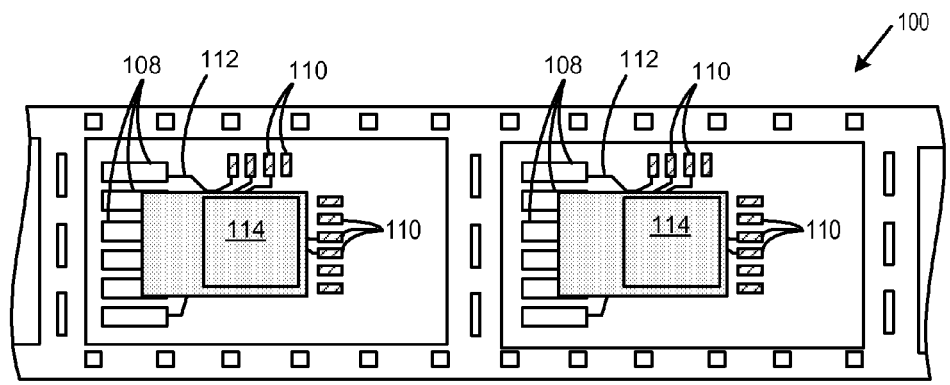
FIGS. 16 through 18 show top, bottom and cross-sectional edge views, respectively of a semiconductor package according to a first embodiment of the present invention during a fifth stage of fabrication.
Figure 17:
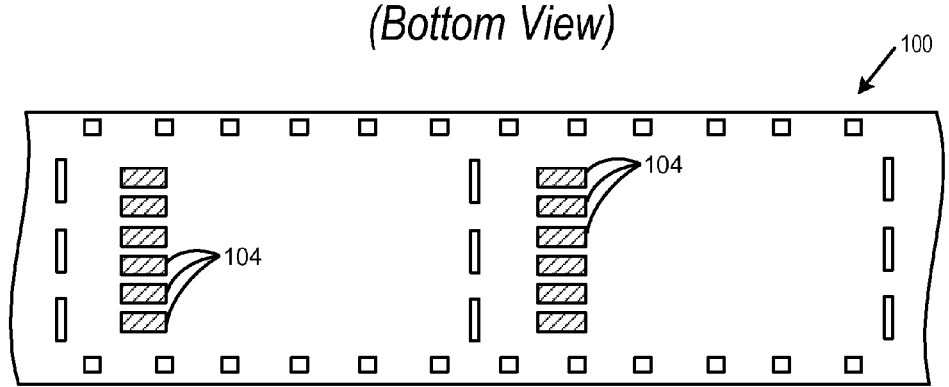
Figure 18:
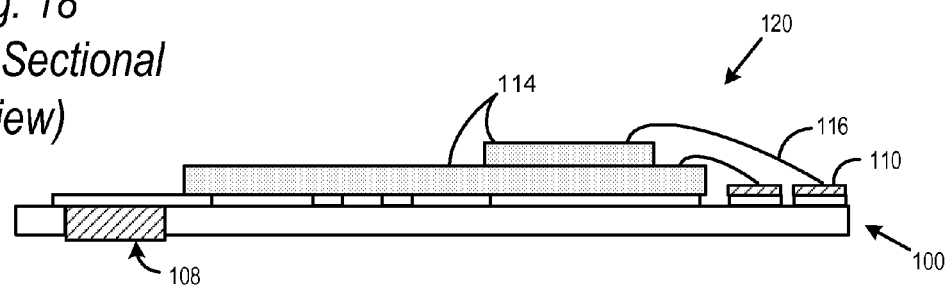

Referring now to FIGS. 16 through 18, one or more semiconductor die 112 may be affixed to the top surface of substrate 100, over portions of the conductive traces and/or contact fingers, using a known die-bond process in step 60. There may be between one and eight semiconductor die 114 provided, and more particularly two to four. The semiconductor die 114 may be any of a number of chips, such as for example those forming a flash memory array and including a controller chip, such as for example an ASIC.

Figure 19:
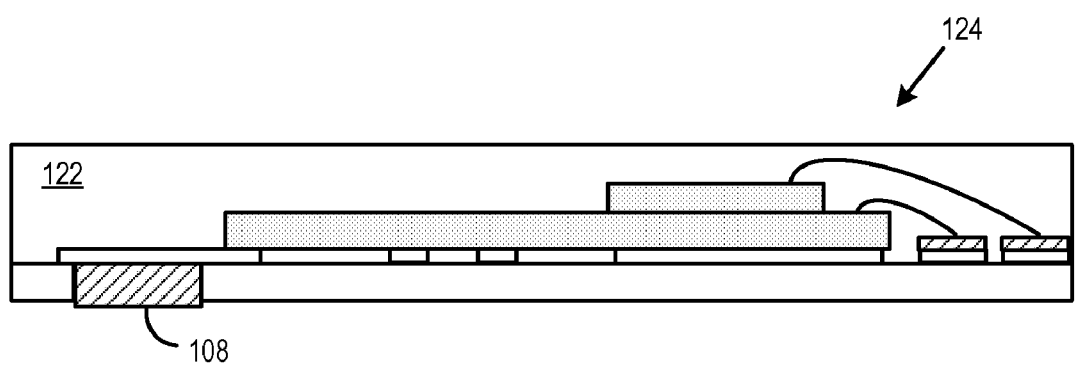
FIG. 19 is a cross-sectional view of a finished semiconductor package according to a first embodiment of the present invention.

Semiconductor die 114 may be electrically coupled to plated bond pads 110 using wire bonds 116 (FIG. 18) in a known wire bond process in step 62. Upon completion of the wire bond process, a substrate 100 and semiconductor die 114 together form an integrated circuit 120. In step 64, each integrated circuit 120 may be encapsulated using a known molding compound 122 (FIG. 19). The integrated circuit 120 may be subjected to electrical test in step 66 and burn-in in step 68 to detect faulty die. In step 70, each integrated circuit from the role of TAB tape may be singulated to provide a finished semiconductor package 124 as seen in FIG. 19. The package 124 may be encapsulated so that plated contact fingers 108 remain exposed to the external environment to electrically couple semiconductor package 124 to a host device.

Semiconductor package 124 as shown in FIG. 19 may be used as a flash memory device. Optionally, the semiconductor package 124 may be welded into one or a pair of lids in a step 72. Package 124 may be used in a standard flash memory enclosure, including for example an SD card, compact flash, smart media, mini SD card, MMC and xD card, or a memory stick. Other standard flash memory packages are also possible. The finished package may be tested in a step 74.

Using the above-described steps, a semiconductor package, such as for example an LGA semiconductor package, may be economically and efficiently formed from a single-sided substrate having a single conductive layer on a top surface of the substrate.

Figure 20:
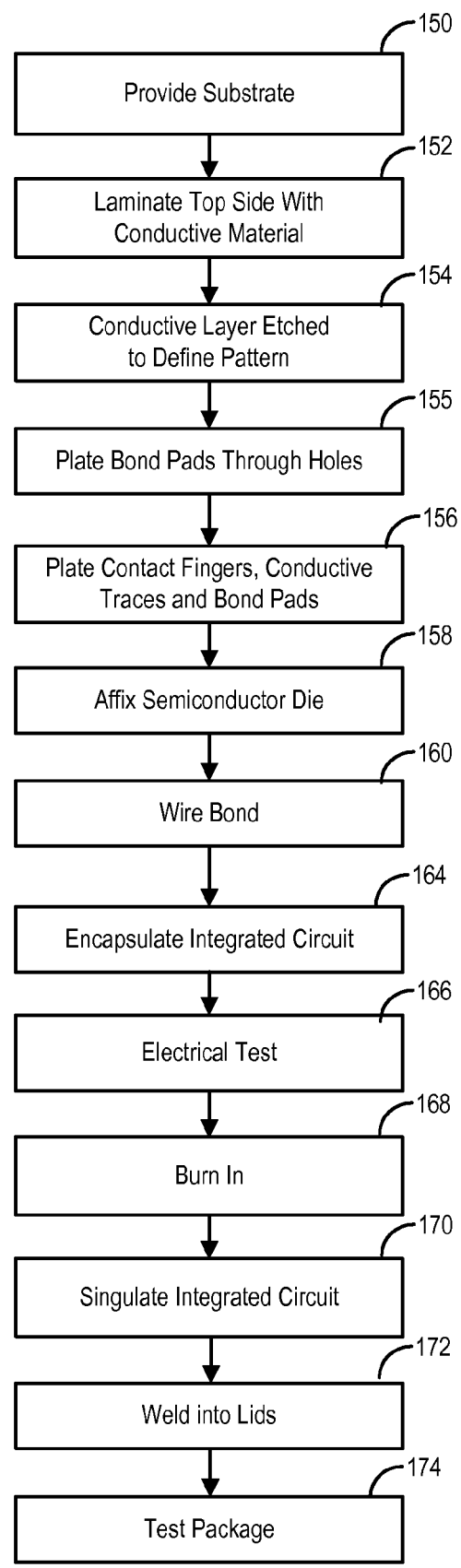
FIG. 20 is a flowchart describing the steps for fabricating a semiconductor package according to a second embodiment of the present invention.
Figure 21:
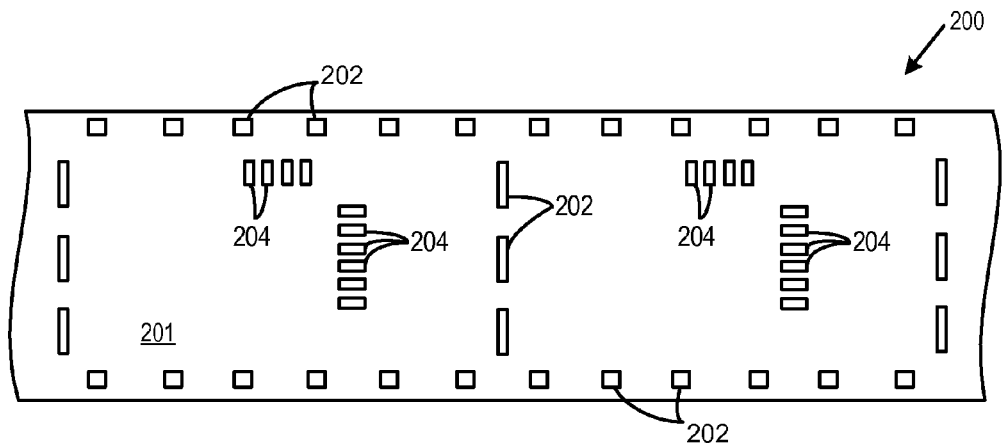
FIGS. 21 through 23 show top, bottom and cross-sectional edge views, respectively of a semiconductor package according to a second embodiment of the present invention during a first stage of fabrication.
Figure 22:
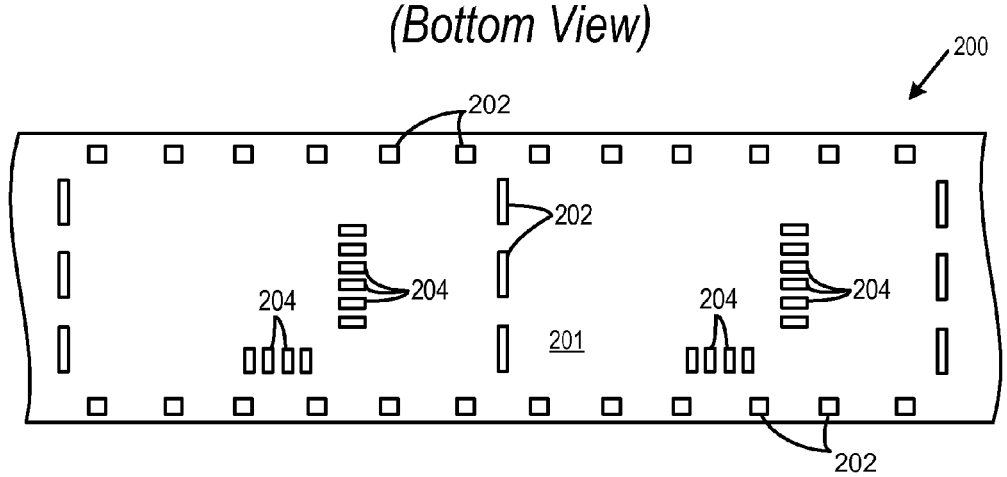
Figure 23:

A second embodiment of the present invention including a single-sided substrate having a conductive layer on a bottom of the substrate, will now be described with reference to the flowchart of FIG. 20, and the views of FIGS. 21 through 36. Referring initially to FIGS. 21 through 23, a substrate 200 may be provided in a step 150. Substrate 200 may be a polyimide TAB tape including a dielectric core 201 as described above. Substrate 200 may include a number of registration holes 202 for registering a position of the substrate 200. Substrate 200 may additionally include a plurality of bond pad holes 204 formed through the dielectric core for allowing electrical connections through the substrate as explained hereinafter. Holes 204 may be formed of a size to fit within the footprint of bond pads described hereinafter.

Figure 24:
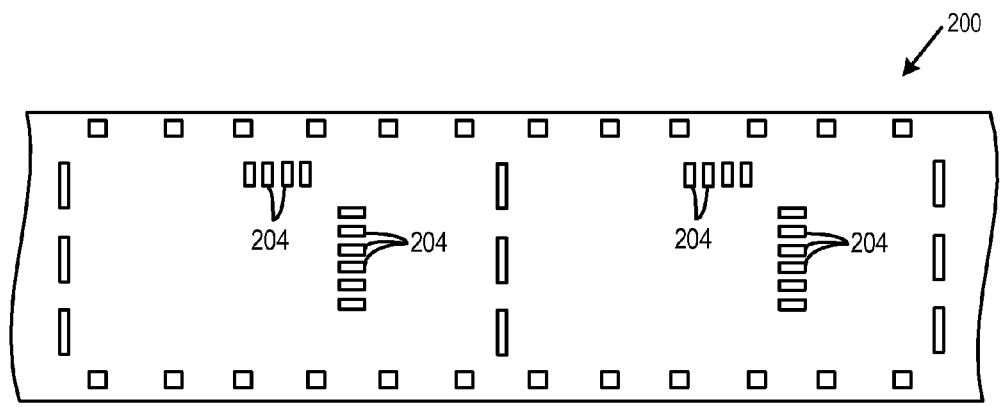
FIGS. 24 through 26 show top, bottom and cross-sectional edge views, respectively of a semiconductor package according to a second embodiment of the present invention during a second stage of fabrication.
Figure 25:
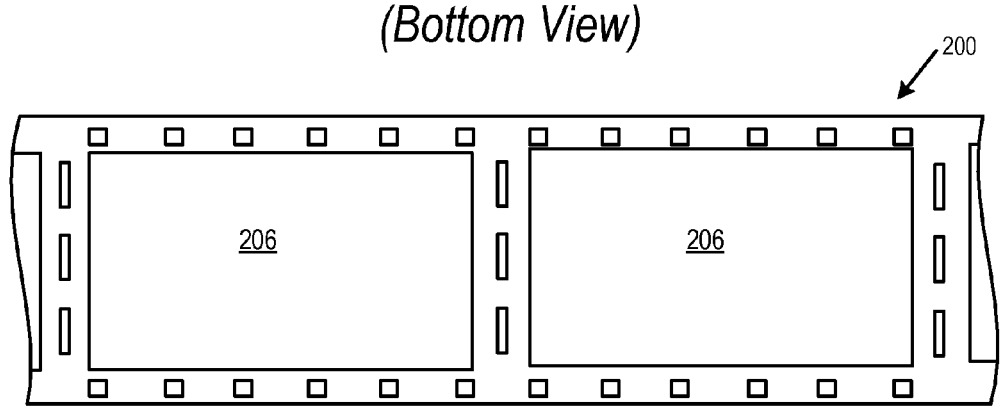
Figure 26:
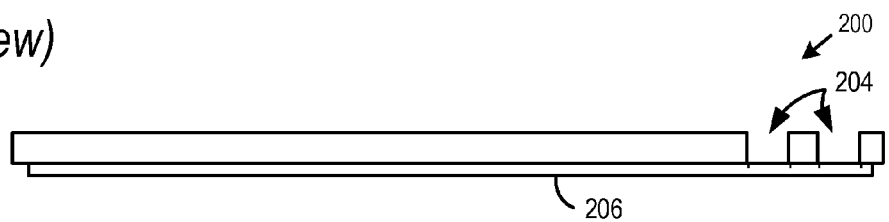

Referring now to FIGS. 24 through 26, a conductive layer 206 may be formed on a bottom surface of the dielectric core 201 in step 152. The conductive layer 206 may be affixed to the dielectric core as described above and the dielectric core and conductive layer 206 may have respective thicknesses as described above. The conductive layer 206 may be in discrete sections as shown or a continuous length.

Figure 27:
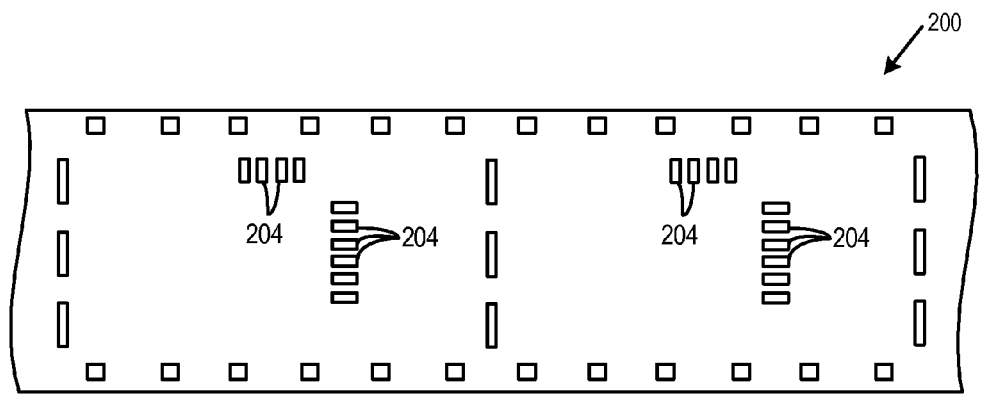
FIGS. 27 through 29 show top, bottom and cross-sectional edge views, respectively of a semiconductor package according to a second embodiment of the present invention during a third stage of fabrication.
Figure 28:
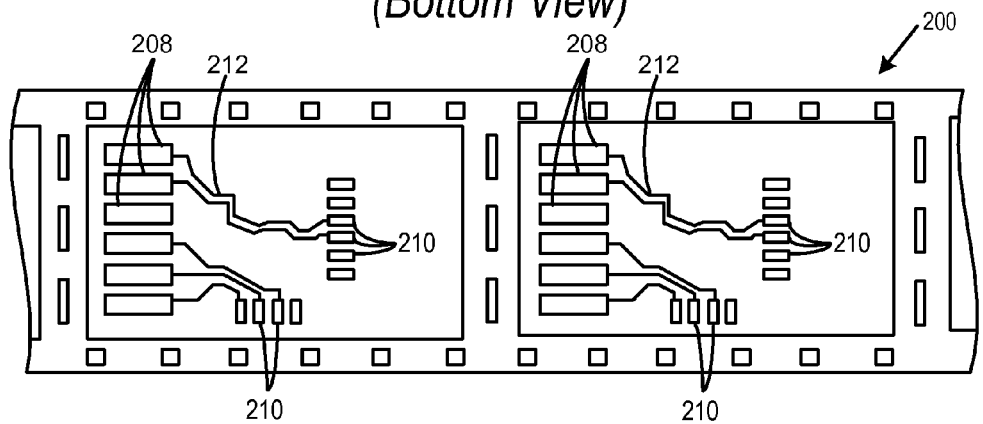
Figure 29:
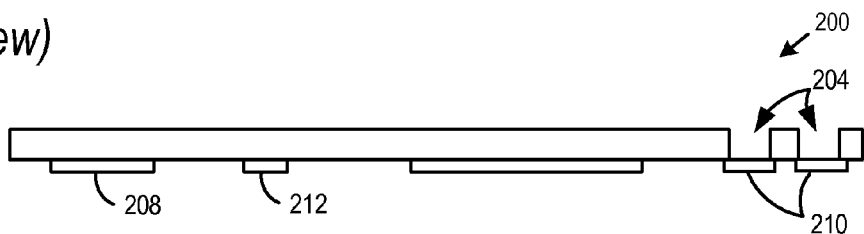

Referring now to FIGS. 27 through 29, in step 154, contact fingers 208, bond pads 210 and conductance pattern 212 may be formed in the conductive layer 206 on the bottom surface of the substrate as described above with respect to conductive layer 106 as in the prior embodiment. Bond pads 210 are defined in the conductive layer so that each bond pad 210 covers a respective bond pad hole 204.

Figure 30:
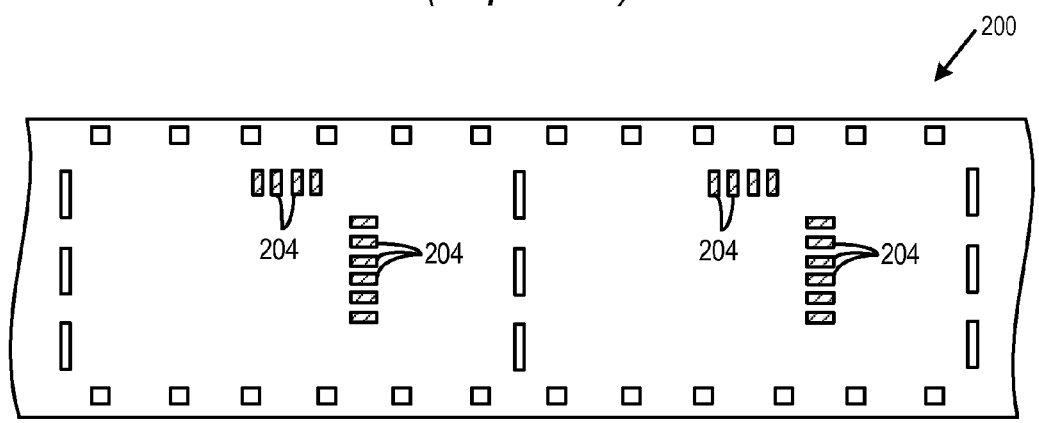
FIGS. 30 through 32 show top, bottom and cross-sectional edge views, respectively of a semiconductor package according to a second embodiment of the present invention during a fourth stage of fabrication.
Figure 31:
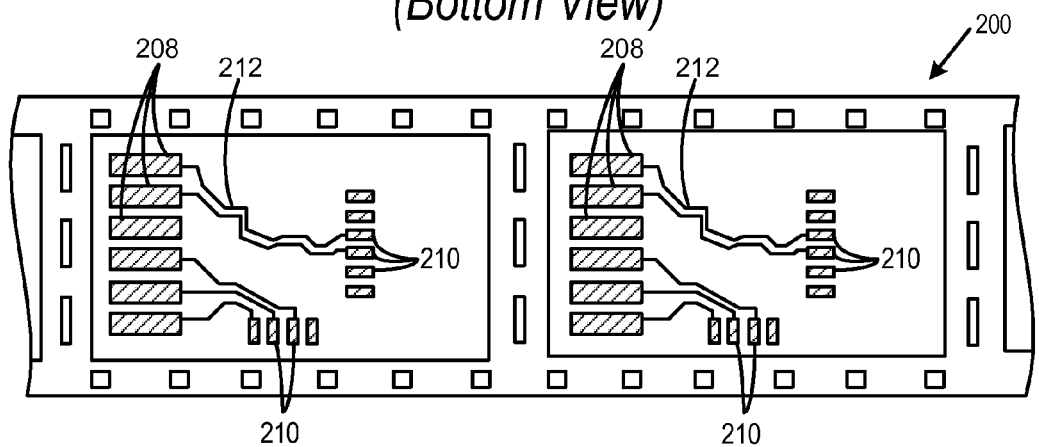
Figure 32:
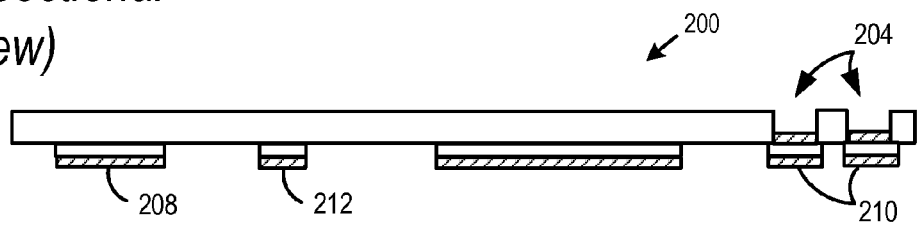

Referring to FIGS. 30 through 32, the surfaces of conductive layer 206 facing core layer 201 and visible through holes 204 may be plated in a step 155. In embodiments, the conductive layer 206 is plated with soft gold or Ni/Au in step 155. As is also shown in FIGS. 30 through 32, the contact fingers 208, bond pads 210 and conductance pattern 212 on the bottom surface of the substrate 100 may also be plated in a step 156. In embodiments, the contact fingers 208, bond pads 210 and conductance pattern 212 may be plated with a layer of hard gold or Ni/Au. A layer of solder mask may be applied to the bond pads 210 and/or conductance pattern 212 instead of or in addition to plating those portions on the bottom surface of the substrate.

Figure 33:
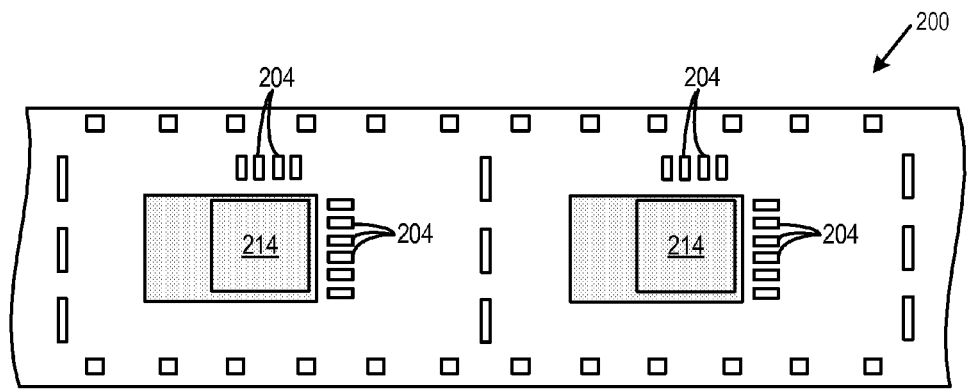
FIGS. 33 through 35 show top, bottom and cross-sectional edge views, respectively of a semiconductor package according to a second embodiment of the present invention during a fifth stage of fabrication.
Figure 34:
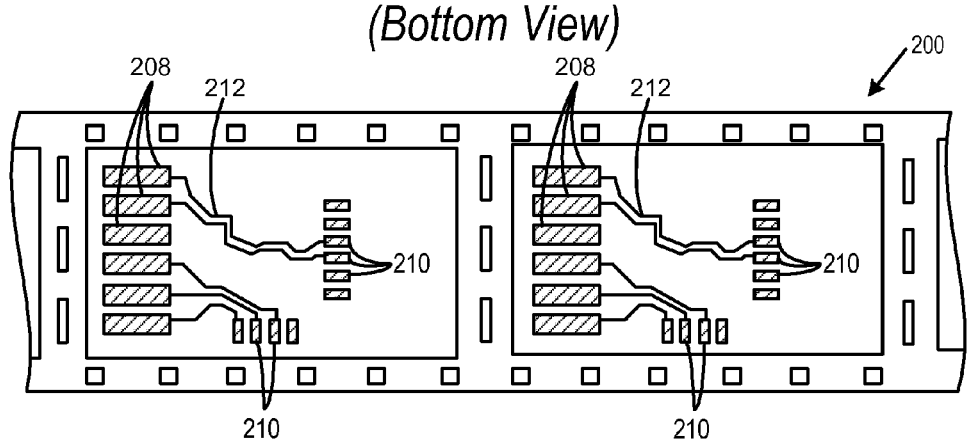
Figure 35:
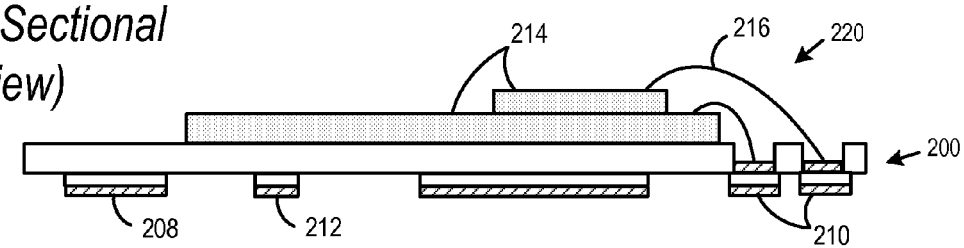

Referring to FIGS. 33-35, in step 158, semiconductor die 214 may be affixed to the top surface of the substrate 200, directly to the dielectric layer 201 in a known die-bond process, opposite the contact fingers 208, bond pads 210 and conductance pattern 212. The number and type of die 214 may be as described above for the first embodiment. In a step 160, the die 214 may be electrically coupled to the substrate 200 in a wire bond process. The wire bond process may entail locating the ends of wire bonds 216 (FIG. 35) within bond pad holes 204 and then securing the wire bonds in electrical contact with soft-plated bond pads 210 by, for example, ultrasonic welding through the holes 204. The bond pad holes 204 allow electrical connection of the semiconductor die on the top side of the dielectric layer to the bond pads and contact fingers on the bottom surface of the dielectric layer.

Upon completion of the wire bond process, a substrate 200 and semiconductor die 214 together form an integrated circuit 220. In step 164, each integrated circuit 220 may be encapsulated using a known molding compound 222 (FIG. 36) to provide a finished semiconductor package 224. The package 224 may be encapsulated so that plated contact fingers 208 remain exposed to the external environment to electrically couple semiconductor package 224 to a host device. In embodiments, to the extent not already covered by solder mask, the bottom surfaces of the substrate 200 may be covered in solder mask, leaving the contact fingers 208 exposed. The integrated circuit 220 may be subjected to electrical test in step 166 and burn-in in step 168 to detect faulty die. In step 170, each integrated circuit from the role of TAB tape may be singulated to form the finished package 224 shown in FIG. 36.

Figure 36:
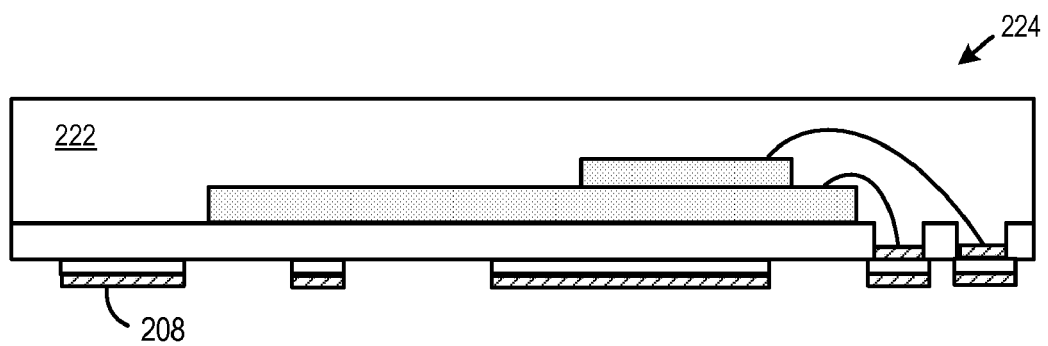
FIG. 36 is a cross-sectional view of a finished semiconductor package according to a second embodiment of the present invention.

Semiconductor package 224 as shown in FIG. 36 may be used as a flash memory device. Optionally, the semiconductor package 224 may be welded into one or a pair of lids in a step 172. Package 224 may be used in a standard flash memory enclosure, including for example an SD card, compact flash, smart media, mini SD card, MMC and xD card, or a memory stick. Other standard flash memory packages are also possible. The finished package may be tested in a step 174.

Using the above-described steps, a semiconductor package, such as for example an LGA semiconductor package may be economically and efficiently formed from a single-sided substrate having a single conductive layer on a top surface of the substrate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of fabricating a semiconductor package, the semiconductor package including a substrate having top and bottom surfaces and one or more semiconductor die on the top surface, the method comprising the steps of:
   (a) defining a plurality of contact fingers in a conductive layer affixed to the top surface of the substrate;
   (b) forming a plurality of holes in substrate positioned to lie beneath the plurality of contact fingers; and
   (c) plating the plurality of contact fingers through the holes formed in the substrate in said step (b) to extend the contact fingers through the substrate.

2. A method as recited in claim 1, wherein said step (c) of plating the plurality of contact fingers through the plurality of holes allows electrical connection of the contact fingers to a host device from a side of the substrate opposite the semiconductor die and conductive layer.

3. A method as recited in claim 1, wherein said step (b) of forming a plurality of holes in substrate comprises the step of forming a plurality of substantially rectangular holes conforming in shape and location to the plurality of contact fingers defined in said step (a).

4. A method of fabricating a semiconductor package, comprising the steps of:
(a) forming a plurality of holes in a dielectric layer, the dielectric layer including first and second surfaces;
(b) providing conductive layer on the first surface of the dielectric layer, the conductive layer having a first surface facing the first surface of the dielectric layer and the conductive layer covering the plurality of holes;
(c) defining a plurality of contact fingers in the conductive layer, each contact finger of the plurality of contact fingers covering a hole of the plurality of holes;
(d) defining bond pads in the conductive layer;
(e) defining conductive traces in the conductive layer electrically coupling at least one bond pad to at least one contact finger;
(f) plating the plurality of contact fingers at the first surface of the conductive layer, through the plurality of holes;
(g) affixing one or more semiconductor die to the first surface of the dielectric layer; and
(h) electrically coupling the one or more semiconductor die to the bond pads.

5. A method as recited in claim 4, wherein said step (a) of forming a plurality of holes in a dielectric layer comprises the step of forming a plurality of holes conforming in location to the plurality of contact fingers defined in said step (c).

6. A method as recited in claim 5, wherein said step (a) of forming a plurality of holes in a dielectric layer comprises the step of forming a plurality of holes conforming in shape to the plurality of contact fingers defined in said step (c).

7. A method as recited in claim 4, wherein said step (f) of plating the plurality of contact fingers at the first surface of the conductive layer, through the plurality of holes comprises the step of extending the contact fingers through the dielectric layer.

8. A method as recited in claim 4, wherein said step (f) of plating the plurality of contact fingers at the first surface of the conductive layer, through the plurality of holes allows electrical connection of the contact fingers to a host device from a side of the dielectric layer opposite the semiconductor die and conductive layer.

9. A method as recited in claim 4, wherein said step (g) of affixing one or more semiconductor die to the first surface of the dielectric layer comprises the step of affixing between two and four semiconductor die to the first surface of the dielectric layer.

10. A method as recited in claim 4, wherein said step (g) of affixing one or more semiconductor die to the first surface of the dielectric layer comprises the step of affixing one or more flash memory chips and a controller chip to the first surface of the dielectric layer.

11. A method as recited in claim 4, wherein said step (f) of plating the plurality of contact fingers at the first surface of the conductive layer comprises the step of plating the contact fingers with gold.

12. A method as recited in claim 4, wherein said step (f) of plating the plurality of contact fingers at the first surface of the conductive layer comprises the step of plating the contact fingers with compound including gold and nickel.

13. A method of fabricating a semiconductor package, comprising the steps of:
(a) forming a plurality of holes in a tape automated bonding tape substrate, the tape substrate including first and second surfaces;
(b) providing conductive layer on the first surface of the tape substrate, the conductive layer having a first surface facing the first surface of the conductive layer and the conductive layer covering the plurality of holes;
(c) defining a plurality of bond pads in the conductive layer;
(d) defining contact fingers in the conductive layer, each contact finger covering a hole of the plurality of holes and each contact finger having a first surface on the first side of the tape substrate, a thickness extending through the plurality of holes in the tape substrate, and a second surface on the second side of the tape substrate;
(e) defining conductive traces in the conductive layer electrically coupling at least one bond pad to at least one contact finger;
(f) affixing one or more semiconductor die to the first surface of the tape substrate;
(g) electrically coupling a semiconductor die to the first surface of the tape substrate and coupling the semiconductor die to a bond pad.

14. A method as recited in claim 13, wherein said step of defining contact fingers in the conductive layer having a thickness extending through the plurality of holes in the tape substrate comprises the step of plating a surface of the contact fingers facing the dielectric layer through the holes formed in said step (a).

15. A method as recited in claim 13, wherein said step (a) of forming a plurality of holes in a dielectric layer comprises the step of forming a plurality of holes conforming in shape to the plurality of contact fingers defined in said step (d).

16. A method as recited in claim 13, wherein said step (f) of affixing one or more semiconductor die to the first surface of the dielectric layer comprises the step of affixing between two and four semiconductor die to the first surface of the dielectric layer.

17. A method as recited in claim 13, wherein said step (f) of affixing one or more semiconductor die to the first surface of the dielectric layer comprises the step of affixing one or more flash memory chips and a controller chip to the first surface of the dielectric layer.

* * * * *